(12) United States Patent
Schubert

(10) Patent No.: US 9,059,377 B2
(45) Date of Patent: *Jun. 16, 2015

(54) SOLID STATE LIGHTING DEVICES WITH LOW CONTACT RESISTANCE AND METHODS OF MANUFACTURING

(71) Applicant: Micron Technology, Inc., Boise, ID (US)

(72) Inventor: Martin F. Schubert, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/028,784

(22) Filed: Sep. 17, 2013

(65) Prior Publication Data

US 2014/0014999 A1 Jan. 16, 2014

Related U.S. Application Data

(63) Continuation of application No. 12/872,137, filed on Aug. 31, 2010, now Pat. No. 8,536,595.

(51) Int. Cl.
*H01L 33/38* (2010.01)
*H01L 33/40* (2010.01)
*H01L 33/42* (2010.01)
*H01L 21/02* (2006.01)

(52) U.S. Cl.
CPC .............. *H01L 33/42* (2013.01); *H01L 33/387* (2013.01); *H01L 33/40* (2013.01); *H01L 21/0237* (2013.01); *H01L 21/02439* (2013.01); *H01L 21/02458* (2013.01); *H01L 21/02521* (2013.01); *H01L 21/0254* (2013.01); *H01L 2933/0016* (2013.01)

(58) Field of Classification Search
None
See application file for complete search history.

(56) References Cited

U.S. PATENT DOCUMENTS

| 6,194,743 B1 | 2/2001 | Kondoh et al. |
| 6,291,839 B1 * | 9/2001 | Lester .............................. 257/91 |
| 6,366,017 B1 | 4/2002 | Antoniadis et al. |

(Continued)

FOREIGN PATENT DOCUMENTS

| JP | 11087771 A | 3/1999 |
| JP | 11220171 A | 8/1999 |

(Continued)

OTHER PUBLICATIONS

Definition of "Between" retrieved on Apr. 19, 2012 from <http://oxforddictionaries.com/definition/between.

(Continued)

*Primary Examiner* — Joseph Schoenholtz
(74) *Attorney, Agent, or Firm* — Perkins Coie LLP

(57) ABSTRACT

Solid state lighting ("SSL") devices with improved contacts and associated methods of manufacturing are disclosed herein. In one embodiment, an SSL device includes a first semiconductor material, a second semiconductor material spaced apart from the first semiconductor material, and an active region between the first and second semiconductor materials. The SSL device also includes a contact on one of the first or second semiconductor materials. The contact includes a first conductive material and a plurality of contact elements in contact with one of the first or second conductive materials. The contact elements individually include a portion of a second conductive material that is different from the first conductive material.

14 Claims, 5 Drawing Sheets

(56) References Cited

U.S. PATENT DOCUMENTS

| | | | |
|---|---|---|---|
| 6,522,063 | B2 | 2/2003 | Chen et al. |
| 6,677,615 | B2 | 1/2004 | Takeuchi et al. |
| 6,797,987 | B2 | 9/2004 | Chen |
| 6,903,374 | B2 | 6/2005 | Katayama |
| 7,345,323 | B2 | 3/2008 | Goetz et al. |
| 7,436,066 | B2 | 10/2008 | Sonobe et al. |
| 8,455,912 | B2 * | 6/2013 | Tanaka et al. ............... 257/99 |
| 2003/0052328 | A1 | 3/2003 | Uemura |
| 2005/0194587 | A1 | 9/2005 | Hsieh et al. |
| 2010/0065881 | A1 | 3/2010 | Kim |
| 2010/0123161 | A1 * | 5/2010 | Takeuchi et al. ............ 257/99 |
| 2010/0283081 | A1 * | 11/2010 | Huang et al. ................. 257/99 |
| 2011/0018024 | A1 * | 1/2011 | Fukshima et al. ............ 257/98 |
| 2011/0210345 | A1 * | 9/2011 | Lim et al. ..................... 257/88 |
| 2012/0049152 | A1 | 3/2012 | Schubert |

FOREIGN PATENT DOCUMENTS

| | | |
|---|---|---|
| JP | 2003243705 A | 8/2003 |
| JP | 2004071655 A | 3/2004 |

OTHER PUBLICATIONS

Film Formation: Growth and Coalescence, Physics of Thin Films, PES 449 / PHYS 549, Film Formation II, retrieved from the Internet, URL: <http://www.uccs.edu/~tchriste/courses/PHYS549/549lectures/film2.html>, 6 pages, Feb. 22, 2000.

Freund, L.B. and S. Suresh, Thin Film Materials: Stress, Defect Formation and Surface Evolution, Cambridge University Press, p. 20, Jan. 2004.

Gessmann, Theodore. "GaInN Light-emitting Diodes with Omni Directional Reflectors." Light-Emitting Diodes: Research, Manufacturing, and Applications VII, Proceedings of SPIE 4996 (2003): 139-44. Light-Emitting Diodes: Research, Manufacturing, and Applications VII, E. Fred Schubert, H. Walter Yao, Kurt J. Linden, Daniel J. McGraw, Editors.

Hibbard, D. L.; Jung, S. P.; Wang, C.; Ullery, D.; Zhao, Y. S.; Lee, H. P.; So, W.; Liu, H.;, "Low resistance high reflectance contacts to p-GaN using oxidized Ni/Au and Al or Ag," Applied Physics Letters, vol. 83, No. 2, pp. 311-313, Jul. 2003.

Kim, Hyunsoo, Sung-Nam Lee, Yongjo Park, and Tae-Yeon Seong. "High-Efficiency GaN-Based Light-Emitting Diodes Fabricated With Metallic Hybrid Reflectors." IEEE Electron Device Letters 29.6 (2008): 582-84.

Kim, Jong Kyu. "Omni-directional Reflectors for Light-emitting Diodes." Proc. of SPIE vol. 6134 (2006): D1-D12. [Light-Emitting Diodes: Research, Manufacturing, and Applications X, edited by Klaus P. Streubel, H. Walter Yao, E. Fred Schubert, Proc. of SPIE vol. 6134, 61340D, (2006)].

Sheu, J. K., I-Hsiu Hung, W. C. Lai, S. C. Shei, and M. L. Lee. "Enhancement in Output Power of Blue Gallium Nitride-based Light-emitting Diodes with Omnidirectional Metal Reflector under Electrode Pads." Applied Physics Letters 93.10 (2008): 103507.

Song, J.O.; Jun-Seok Ha; Tae-Yeon Seong;, "Ohmic-Contact Technology for GaN-Based Light-Emitting Diodes: Role of P-Type Contact," Electron Devices, IEEE Transactions on , vol. 57, No. 1, pp. 42-59, Jan. 2010.

Thomas Gessmann, H. Luo, Jing-Qun Xi, Klaus P. Streubel and E. Fred Schubert, "Light-emitting diodes with integrated omnidirectionally reflective contacts", Proc. SPIE 5366, 53 (2004).

Wikipedia on "Lift-off" retrieved on 2012-14-18 from <http://en.wikipedia.org/wiki/Lift-off_(microtechnology).

* cited by examiner

US 9,059,377 B2

SOLID STATE LIGHTING DEVICES WITH LOW CONTACT RESISTANCE AND METHODS OF MANUFACTURING

CROSS-REFERENCE TO RELATED APPLICATION

This application is a continuation of U.S. application Ser. No. 12/872,137 filed Aug. 31, 2010, now U.S. Pat. No. 8,536,595, which is incorporated herein by reference in its entirety.

TECHNICAL FIELD

The present disclosure is related to solid state lighting ("SSL") devices with low contact resistance and associated methods of manufacturing.

BACKGROUND

Mobile phones, personal digital assistants ("PDAs"), digital cameras, MP3 players, and other portable electronic devices utilize SSL devices (e.g., LEDs) for background illumination. SSL devices are also used for signage, indoor lighting, outdoor lighting, and other types of general illumination. FIG. 1A is a cross-sectional view of a conventional SSL device 10 with lateral contacts. As shown in FIG. 1A, the SSL device 10 includes a substrate 12 carrying an LED structure 11 having N-type gallium nitride (GaN) 14, GaN/indium gallium nitride (InGaN) multiple quantum wells ("MQWs") 16, and P-type GaN 18. The SSL device 10 also includes a first contact 20 on the P-type GaN 18 and a second contact 22 on the N-type GaN 14. The first contact 20 typically includes a transparent and conductive material (e.g., indium tin oxide ("ITO")) to allow light to escape from the LED structure 11. FIG. 1B is a cross-sectional view of another conventional LED device 10' in which the first and second contacts 20 and 22 are opposite of each other. In the LED device 10', the first contact 20 typically includes a reflective and conductive material (e.g., aluminum or silver) to direct light toward the N-type GaN 14.

As discussed in more detail below, it has been observed that materials with good transparent or reflective properties often do not form satisfactory Ohmic contacts with components of the SSL structure 11, and vice versa. For example, the SSL device 10 having ITO in contact with the P-type GaN 18 may have undesirable high series resistance. In another example, silver processed to maintain its reflectivity may form a Schottky barrier with the P-type GaN 18. The high series resistance and/or Schottky barrier may result in parasitic electrical impedance during operation and/or otherwise degrade the electrical performance of the LED devices. In yet another example, if silver is annealed at high temperatures to form good electrical contact with the SSL structure 11, its reflectivity may degrade. Accordingly, it would be desirable to mitigate the impact of electrical contact resistance in SSL devices.

DETAILED DESCRIPTION

Various embodiments of SSL devices with low contact resistance and associated methods of manufacturing are described below. As used hereinafter, the term "SSL device" generally refers to devices with LEDs, organic light emitting diodes ("OLEDs"), laser diodes ("LDs"), polymer light emitting diodes ("PLEDs"), and/or other suitable sources of radiation other than electrical filaments, a plasma, or a gas. A person skilled in the relevant art will also understand that the technology may have additional embodiments, and that the technology may be practiced without several of the details of the embodiments described below with reference to FIGS. 3A-7B.

Figure 1A:
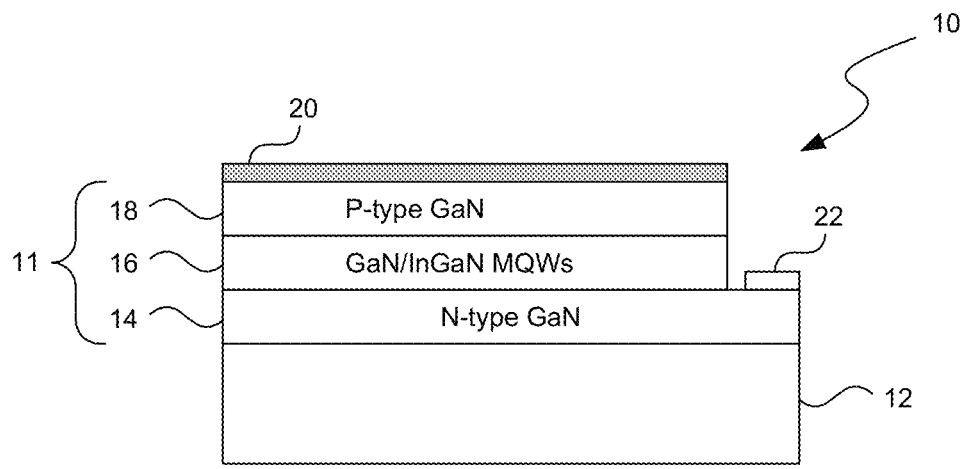
FIG. 1A is a schematic cross-sectional diagram of an SSL device in accordance with the prior art.
Figure 1B:
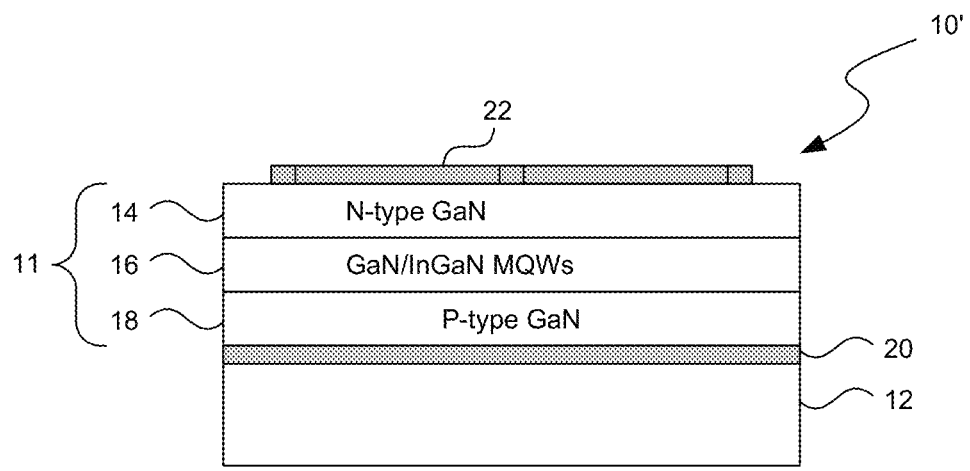
FIG. 1B is a schematic cross-sectional diagram of another SSL device in accordance with the prior art.
Figure 2A:
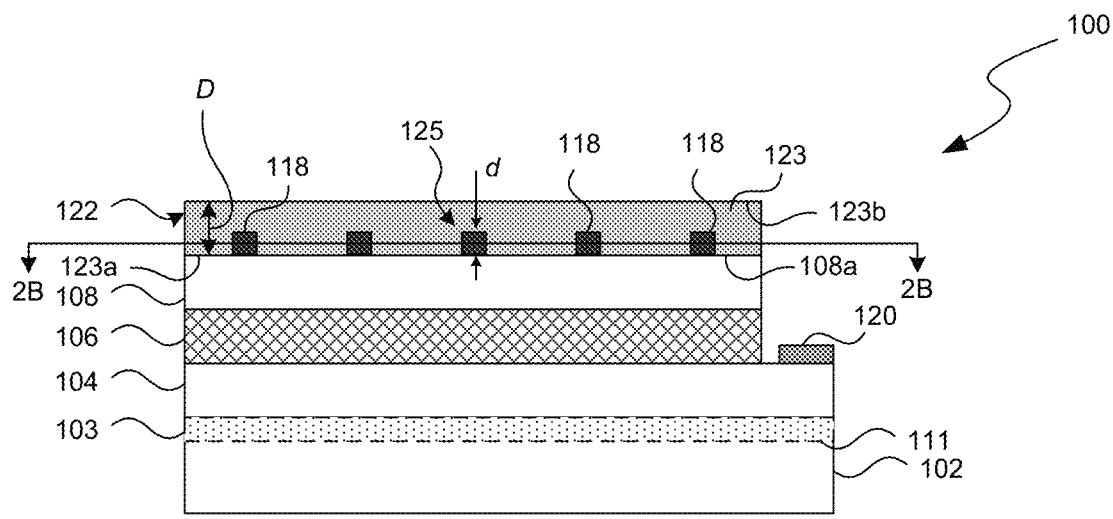
FIG. 2A is a cross-sectional view of an SSL device in accordance with embodiments of the technology.

FIG. 2A is a schematic cross-sectional diagram of an SSL device 100 with lateral contacts in accordance with embodiments of the technology. As shown in FIG. 2A, the SSL device 100 can include a substrate material 102, an optional buffer material 103, a first semiconductor material 104, an active region 106, and a second semiconductor material 108 in series. The SSL device 100 can also include a first contact 120 on the first semiconductor material 104 and a second contact 122 on the second semiconductor material 108. In the illustrated embodiment, the first and second contacts 120 and 122 are arranged laterally relative to each other. In other embodiments, the SSL device 100 can also be arranged vertically relative to each other or can have other suitable contact configurations, as discussed in more detail below with reference to FIGS. 4A and 4B. In any of these embodiments, the SSL device 100 can optionally include a reflective material (e.g., a silver film), a carrier material (e.g., a ceramic substrate), an optical component (e.g., a collimator), and/or other suitable components.

In certain embodiments, the substrate material 102 can include silicon (Si), at least a portion of which has the Si(1,1,1) crystal orientation. In other embodiments, the substrate material 102 can include silicon with other crystal orientations (e.g., Si(1,0,0)), AlGaN, GaN, silicon carbide (SiC), sapphire ($Al_2O_3$), zinc oxide ($ZnO_2$), a combination of the foregoing materials and/or other suitable substrate materials. In the illustrated embodiment, the substrate material 102 has a generally planar surface 111 proximate to the optional buffer material 103. In other embodiments, the substrate material 102 may also include a non-planar surface (e.g., having openings, channels, and/or other surface features, not shown).

The optional buffer material 103 can facilitate the formation of the first and second semiconductor materials 104 and 108 and the active region 106 on the substrate material 102. In certain embodiments, the optional buffer material 103 can include at least one of aluminum nitride (AlN), aluminum-gallium nitride (AlGaN), zinc nitride (ZnN), GaN, and/or other suitable materials. In other embodiments, the optional buffer material 103 may be omitted, and the first semiconductor material 104 may be formed directly on the substrate material 102.

In certain embodiments, the first semiconductor material 104 can include N-type GaN (e.g., doped with silicon (Si)), and the second semiconductor material 108 can include P-type GaN (e.g., doped with magnesium (Mg)). In other embodiments, the first semiconductor material 104 can include P-type GaN, and the second semiconductor material 108 can include N-type GaN. In further embodiments, the first and second semiconductor materials 104 and 108 can each include at least one of gallium arsenide (GaAs), aluminum gallium arsenide (AlGaAs), gallium arsenide phosphide (GaAsP), gallium(III) phosphide (GaP), zinc selenide (ZnSe), boron nitride (BN), AlGaN, and/or other suitable semiconductor materials.

The active region 106 can include a single quantum well ("SQW"), MQWs, and/or a bulk semiconductor material. As used hereinafter, a "bulk semiconductor material" generally refers to a single grain semiconductor material (e.g., InGaN) with a thickness greater than about 10 nanometers and up to about 500 nanometers. In certain embodiments, the active region 106 can include an InGaN SQW, GaN/InGaN MQWs, and/or an InGaN bulk material. In other embodiments, the active region 106 can include aluminum gallium indium phosphide (AlGaInP), aluminum gallium indium nitride (AlGaInN), and/or other suitable materials or configurations.

In certain embodiments, the first semiconductor material 104, the active region 106, the second semiconductor material 108, and the optional buffer material 103 can be formed on the substrate material 102 via metal organic chemical vapor deposition ("MOCVD"), molecular beam epitaxy ("MBE"), liquid phase epitaxy ("LPE"), and/or hydride vapor phase epitaxy ("HVPE"). In other embodiments, at least one of the foregoing components may be formed via other suitable epitaxial growth techniques.

In certain embodiments, the first contact 120 can include copper (Cu), aluminum (Al), silver (Ag), gold (Au), platinum (Pt), and/or other suitable conductive material. In other embodiments, the first contact 120 can include ITO, aluminum zinc oxide ("AZO"), fluorine-doped tin oxide ("FTO"), and/or other suitable transparent and conductive oxide ("TCOs"). Techniques for forming the first contact 120 can include MOCVD, MBE, spray pyrolysis, pulsed laser deposition, sputtering, electroplating, and/or other suitable deposition techniques.

The second contact 122 can include a conductive material 123 and a contact material 118 between the second semiconductor material 108 and the conductive material 123. The conductive material 123, for example, can be a transparent conductive material. As shown in FIG. 2A, the conductive material 123 includes a first surface 123a in contact with a surface 108a of the second semiconductor material 108 and a second surface 123b opposite the first surface 123a.

The contact material 118 can include a material that forms satisfactory mechanical and/or electrical contact with both the second semiconductor material 108 and the conductive material 123. In certain embodiments, the conductive material 123 includes ITO, AZO, FTO, and/or other suitable TCOs. The contact material 118 can include silver (Ag). Without being bound by theory, it is believed that silver can form good electrical contact with both the second semiconductor material 108 and the conductive material 123 containing a TCO without high series resistance or forming a Schottky barrier. Thus, the interface between the contact material 118 and the second semiconductor material 108 has a higher electrical conductance than the interface between the conductive material 123 and the second semiconductor material 108. As a result, compared to the contact described above in the Background section, the electrical connection between the second semiconductor material 108 and the conductive material 123 can be improved by interposing the contact material 118 therebetween. In other embodiments, the contact material 118 can also include gold (Au), platinum (Pt), and/or other suitable metals.

In the illustrated embodiment, the contact material 118 extends from the surface 108a of the second semiconductor material 108 to an intermediate depth d between the first and second surfaces 123a and 123b. In other embodiments, at least a portion of the contact material 118 may extend the entire depth D between the first and second surfaces 123a and 123b. In further embodiments, the SSL device 100 may include a support material (not shown) that holds the contact material 118, as discussed in more detail below with reference to FIG. 3.

Figure 2B:
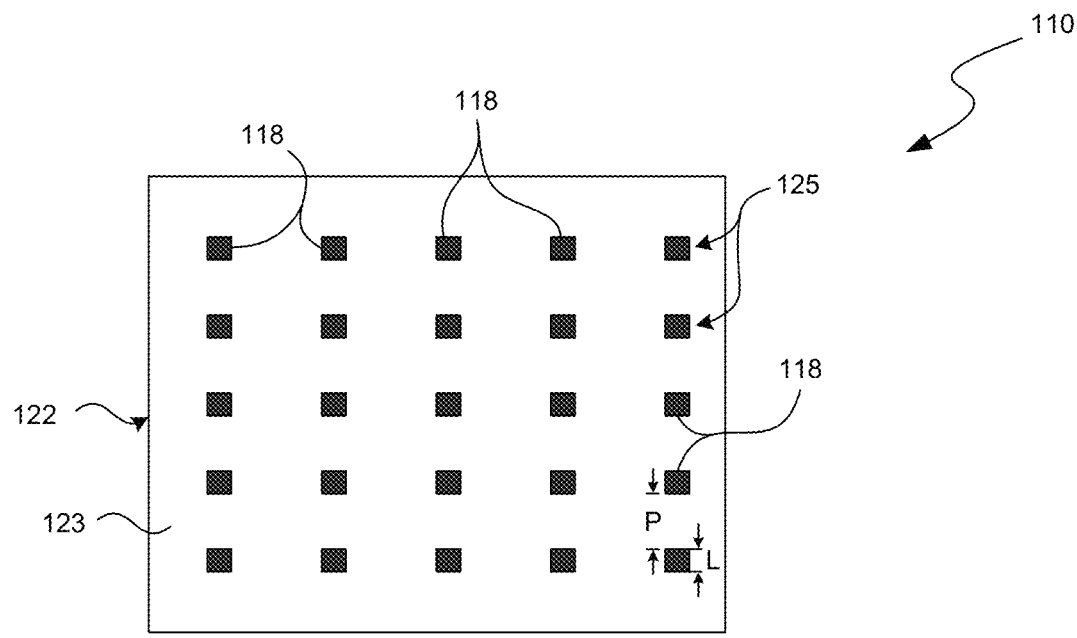
FIG. 2B is a plan view of the SSL device in FIG. 2A.

The contact material 118 can also have a pattern and/or other characteristics such that the contact material 118 does not significantly affect the optical property of the conductive material 123. For example, the optical property of the combined conductive material 123 and the contact material 118 can be generally similar to that of the conductive material 123 by itself. As shown in FIG. 2B, portions of the contact material 118 (hereinafter referred to as "contact elements 125") are arranged as an array of small pillars or pads that have a generally rectangular cross section. A five by five array of the contact elements 125 is shown for illustration purposes, though the array may be of any suitable size. In the illustrated embodiment, a minimum spacing P of the contact elements 125 is significantly larger (e.g., by a factor of 3 or more) than a size L (e.g., cross-sectional dimension) of the individual contact elements 125. Without being bound by theory, it is believed that such a spacing-to-size ratio does not significantly affect the optical property of the conductive material 123. In other embodiments, the contact elements 125 may have other suitable spacing arrangements and/or individual sizes. In further embodiments, the contact elements 125 may be arranged in other patterns or arranged randomly.

At least one of a spacing P, size, shape, and quantity of the contact elements 125 may be adjusted to determine the pattern and/or other characteristics. In certain embodiments, the spacing P, size, shape, and quantity of the contact elements 125 may be adjusted based on empirical data. In other embodiments, the spacing P, size, shape, and quantity of the contact elements 125 may be adjusted based on light interference calculations. In further embodiments, a combination of the foregoing techniques may be used.

Even though the contact elements 125 are shown as having generally the same shape and size in FIG. 2B, in other embodiments, the individual contact elements 125 may have different sizes, shapes, and/or other characteristics. For example, in certain embodiments, at least one of a size, a shape, a distribution, and/or other suitable characteristics of the contact elements 125 may be adjusted based on a target current density profile in the SSL device 100, as discussed in more detail in U.S. patent application Ser. No. 12/872,092, entitled "SOLID STATE LIGHTING DEVICES WITH IMPROVED CONTACTS AND ASSOCIATED METHODS OF MANUFACTURING," filed Aug. 31, 2010.

In further embodiments, the conductive material 123 and the contact material 118 may include a generally similar material (e.g., silver) but formed with different processes. For example, in one embodiment, the contact material 118 containing silver may be formed initially on the surface 108a of the second semiconductor material 108. The formed contact material 118 may be annealed to yield a satisfactory electrical connection with the second semiconductor material 108. However, it is believed that the annealing process may degrade the reflectivity of the contact material 118. To at least reduce the impact of the reflectivity reduction, the conductive material 123 also containing silver may be formed on the second semiconductor material 108 and the contact material 118 without undergoing annealing. Thus, the conductive material 123 may still retain its good reflectivity. As a result, in the foregoing embodiment, the second contact 122 is substantially entirely constructed from silver but is still patterned to yield a good balance between reflectivity and contact resistance.

Figure 2C:
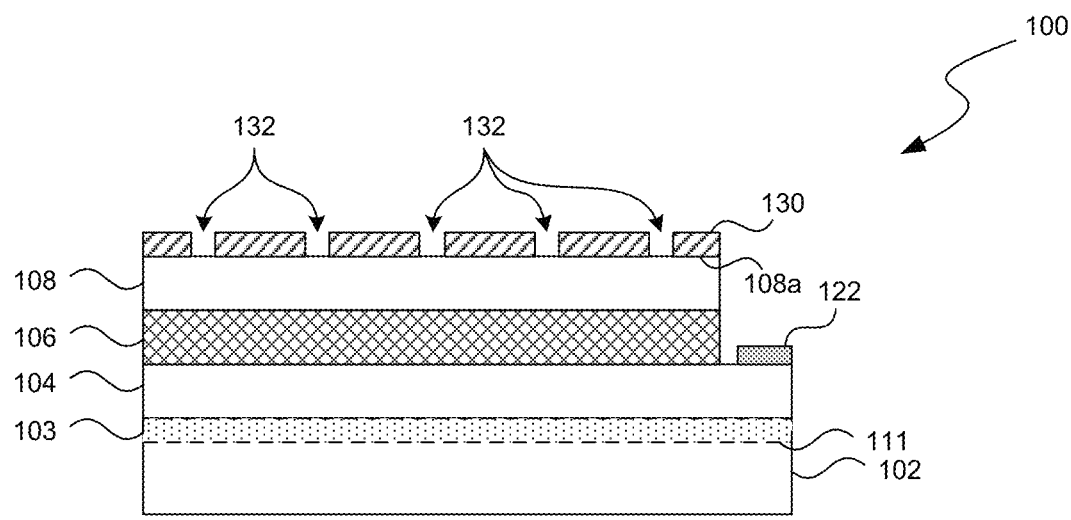
FIGS. 2C and 2D are cross-sectional views of a microelectronic substrate undergoing a process for forming the SSL device in FIG. 2A.
Figure 2D:
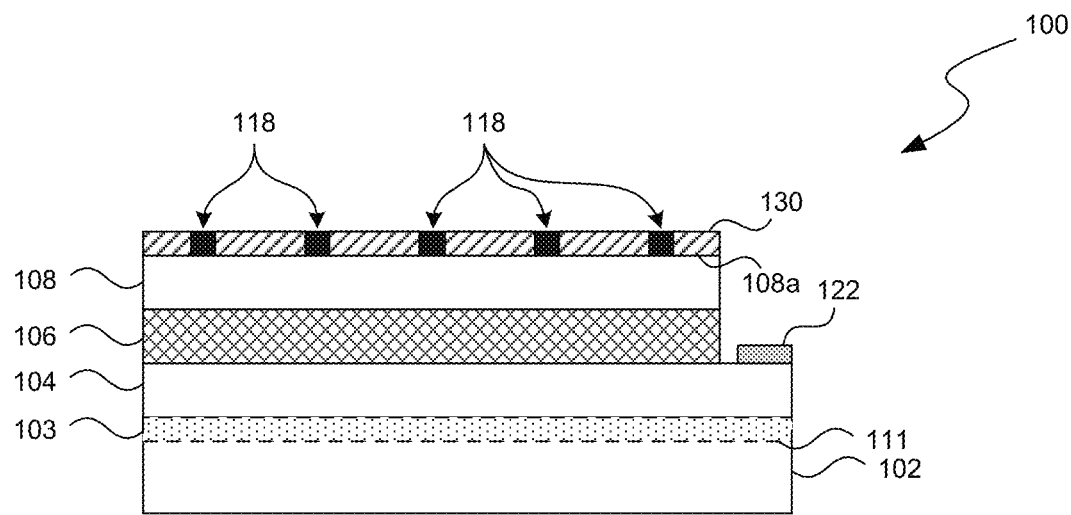

FIGS. 2C and 2D are cross-sectional views of a microelectronic substrate undergoing a process for forming the SSL device 100 in FIG. 2A. As shown in FIG. 2C, an initial stage of the process can include forming the first semiconductor material 104, the active region 106, and the second semiconductor material 108 on the substrate material 102 with the optional buffer material 103. Another stage of the process can include depositing a masking material 130 (e.g., a photoresist) on the surface 108a of the second semiconductor material 108. The masking material 130 can then be patterned (e.g., via photolithography) to form one or more openings 132 generally corresponding to the contact material 118 (FIG. 2A). The openings 132 each expose a portion of the surface 108a of the second semiconductor material 108.

FIG. 2D shows another stage of the process in which the contact material 118 is deposited onto the exposed portion of the surface 108a of the second semiconductor material 108 through the openings 132. After depositing the contact material 118, excess contact material 118 (not shown) and the masking material 130 may be removed with dry etching, wet etching, laser ablation, and/or other suitable material removal techniques. Optionally, the deposited contact material 118 may be annealed and/or undergoing other suitable operations. The process can then include depositing the conductive material 123 onto the second semiconductor material 108 and the contact material 118 to yield the SSL device 100 as shown in FIG. 2A. Techniques for depositing the conductive material 123 can include chemical vapor deposition ("CVD"), atomic layer deposition ("ALD"), spin coating, and/or other suitable deposition techniques. In certain embodiments, the SSL device 100 with the deposited conductive material 123 may be further processed without annealing the conductive material 123. In other embodiments, the SSL device with the deposited conductive material 123 may be annealed at the same and/or different temperatures as those for annealing the contact material 118.

In further embodiments, the contact material 118 and/or the conductive material 123 may be formed via other suitable techniques. For example, instead of forming the contact material 118 through the apertures 132 in the masking material 130, the contact material 118 may be formed to cover a substantial portion of the surface 108a of the second semiconductor material 108. The formed contact material 118 may then be patterned and etched to form the array shown in FIG. 2B. The process can then include depositing the conductive material 123 onto the second semiconductor material 108 and the contact material 118 to yield the SSL device 100 as shown in FIG. 2A.

Figure 3:
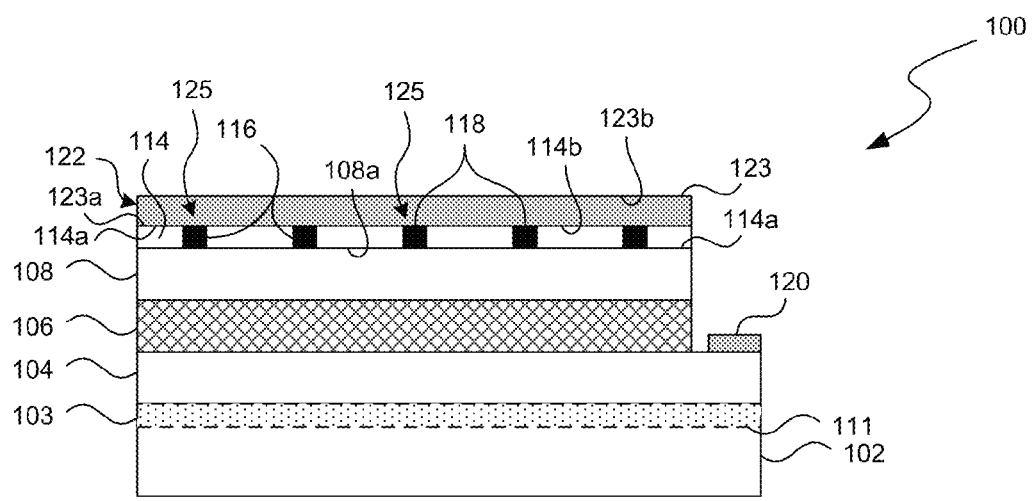
FIG. 3 is a cross-sectional view of another SSL device in accordance with embodiments of the technology.

Even though the SSL device 100 is shown in FIG. 2A as having the conductive material 123 encapsulating the contact material 118, in other embodiments, the SSL device 100 may include a support material that carries the contact material 118. For example, as shown in FIG. 3, another embodiment of the SSL device 100 can include a support material 114 between the conductive material 123 and the second semiconductor material 108. As shown in FIG. 3, the support material 114 includes a first support surface 114a in contact with the surface 108a of the second semiconductor material 108 and a second surface 114b in contact with the first surface 123a of the conductive material 123. In the illustrated embodiment, the support material 114 includes a plurality of apertures 116 extending between the first and second support surfaces 114a and 114b. The apertures 116 each contain a portion of the contact material 118 to form the contact elements 125. As a result, the contact elements 125 contact the second semiconductor material 108 proximate the first support surface 114a and the conductive material 123 proximate the second support surface 114b. In other embodiments, the contact elements 125 may extend into at least one of the second semiconductor material 108 and the conductive material 123.

In certain embodiments, the support material 114 can include a TCO that is different from the conductive material 123. For example, the support material 114 can include AZO while the conductive material 123 includes ITO. In other embodiments, the support material 114 can also include a TCO that is generally similar to that of the conductive material 123. In further embodiments, the support material 114 can include silicon dioxide ($SiO_2$), silicon nitride (SiN), and/or other dielectric and transparent materials.

Figure 4A:
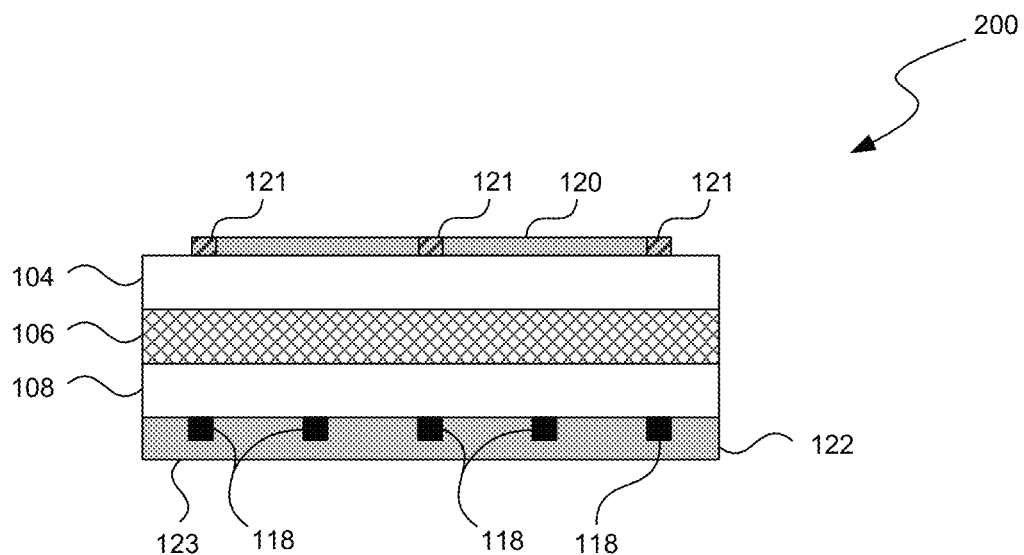
FIG. 4A is a cross-sectional view of yet another SSL device in accordance with embodiments of the technology.
Figure 4B:
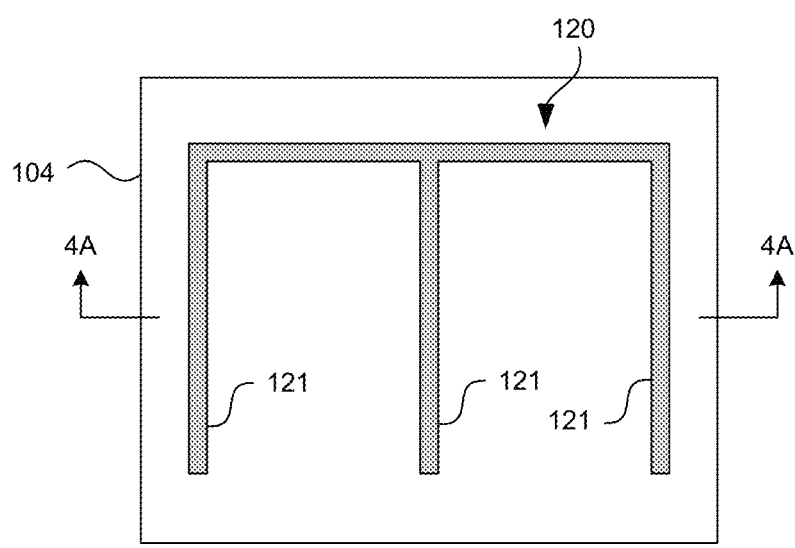
FIG. 4B is a plan view of the SSL device in FIG. 4A.

FIGS. 4A and 4B are cross-sectional and plan views of an SSL device 200 with vertical contacts in accordance with embodiments of the technology. As shown in FIG. 4A, the SSL device 200 can include a first contact 120 spaced apart from a second contact 122. The first contact 120 is proximate the first semiconductor material 104, and the second contact 122 is proximate the second semiconductor material 108. As shown in FIG. 4B, the first contact 120 can include contact fingers 121 on the first semiconductor material 104. Three contact fingers 121 are shown for illustration purposes though the first contact 120 may include any suitable number of contact fingers 121.

Referring back to FIG. 4A, the second contact 122 of the SSL device 200 can have a reflective conductive material 123 that includes a reflective (and conductive) material instead of a transparent (and conductive) material. For example, in one embodiment, the conductive material 123 includes aluminum (Al), and the contact material 118 includes silver (Ag). In other embodiments, the conductive material 123 can include other suitable reflective, conductive materials, and the contact material 118 can include gold (Au), platinum (Pt), and/or other suitable metals. Similar to the embodiments discussed above with reference to FIG. 2A, the contact elements 125 can also be configured to have a pattern and/or other suitable property such that the reflective property of the conductive material 123 is generally maintained.

Without being bound by theory, it is believed that aluminum is highly reflective. As a result, more light may be extracted from the first semiconductor material 104 when aluminum is used as the conductive material 123 in the second contact 122. However, it is also believed that aluminum forms a Schottky barrier with GaN, InGaN, or other types of semiconductor materials. As a result, the second contact 122 may have poor electrical properties (e.g., high forward-voltage drop). It is further believed that silver can form generally Ohmic contacts with both aluminum and GaN, InGaN, or other types of semiconductor materials. Accordingly, by interposing the contact material 118 containing silver between the conductive material 123 and the second semiconductor material 108, electrical connections can be improved over conventional devices while the reflective property of the conductive material 123 is maintained.

Even though the SSL device 200 is shown in FIG. 4A as having the conductive material 123 encapsulating the contact material 118, in other embodiments, the SSL device 100 may include an support material that carries the contact material 118, as generally similar to that discussed in more detail above with reference to FIG. 3. In further embodiments, the contact elements 125 can also be configured based on a target current density profile in the SSL device 200, as discussed in more detail above with reference to FIGS. 2A and 2B.

From the foregoing, it will be appreciated that specific embodiments of the technology have been described herein for purposes of illustration, but that various modifications may be made without deviating from the disclosure. In addition, many of the elements of one embodiment may be combined with other embodiments in addition to or in lieu of the elements of the other embodiments. Accordingly, the disclosure is not limited except as by the appended claims.

I claim:

1. A solid state lighting (SSL) device, comprising:
 a first semiconductor material;
 a second semiconductor material spaced apart from the first semiconductor material;
 an active region between the first and second semiconductor materials; and
 a contact on one of the first and second semiconductor materials, the contact including a first material that is transparent and conductive, a second material that includes silver in contact with both the first material and the one of the first and second semiconductor materials, and a support material between the first material and the first semiconductor material,
 wherein
  the support material is transparent and conductive,
  the support material has a first support surface in contact with the first semiconductor material and a second support surface in contact with the first material,
  the support material has a plurality of apertures extending between the first and second support surfaces,
  the apertures individually contain a portion of the second material, and
  the second material forms an Ohmic contact with the first material, the support material, and the one of the first and second semiconductor materials.

2. The SSL device of claim 1 wherein the first material includes at least one of indium tin oxide, aluminum zinc oxide, and fluorine-doped tin oxide.

3. The SSL device of claim 2 wherein the support material includes at least one of indium tin oxide, aluminum zinc oxide, and fluorine-doped tin oxide.

4. The SSL device of claim 1 wherein the second material includes a plurality of pillars arranged in an array.

5. The SSL device of claim 1 wherein the second material includes a plurality of contact elements arranged in an array with a spacing between individual contact elements that is at least three times of a size of the individual contact elements.

6. The SSL device of claim 1 wherein:
 the contact is a first contact on the first semiconductor material;
 the SSL device further includes a second contact on the second semiconductor material;
 the second contact is spaced apart from the first contact by the first semiconductor material, the active region, and the second semiconductor material;
 the first semiconductor material includes a P-type gallium nitride (GaN) material;
 the second semiconductor material includes an N-type GaN material; and
 the active region include at least one of a bulk indium gallium nitride (InGaN) material, an InGaN single quantum well ("SQW"), and GaN/InGaN multiple quantum wells ("MQWs").

7. A method of forming a solid state lighting (SSL) device, comprising:
 forming an SSL structure on a substrate material, the SSL structure including a first semiconductor material, a second semiconductor material spaced apart from the first semiconductor material, and an active region between the first and second semiconductor materials;
 forming a plurality of contact elements on one of the first and second semiconductor materials, wherein forming the plurality of contact elements includes
  depositing a support material onto the one of the first and second semiconductor materials, wherein the support material is transparent and conductive,
  patterning the support material to form a plurality of openings, and
  depositing silver onto the one of the first and second semiconductor materials via the openings, wherein the deposited silver forms a first Ohmic contact with the one of the first and second semiconductor materials; and
 depositing a conductive material onto the deposited silver and the support material, the conductive material being transparent and forming a second Ohmic contact with the deposited silver.

8. The method of claim 7 wherein the conductive material includes at least one of indium tin oxide, aluminum zinc oxide, and fluorine-doped tin oxide.

9. The method of claim 8 wherein the support material includes at least one of indium tin oxide, aluminum zinc oxide, and fluorine-doped tin oxide.

10. The method of claim 7 wherein forming the plurality of contact elements further includes pattering the support material to separate the openings by a predetermined amount of spacing between the individual openings.

11. The method of claim 7 wherein depositing the silver onto the one of the first and second semiconductor materials comprises forming a plurality of conductive pillars.

12. The method of claim 7 wherein depositing the silver onto the one of the first and second semiconductor materials comprises forming a plurality of conductive pads arranged in a uniform array.

13. The SSL device of claim 1 wherein the first conductive material is different than the support material.

14. The method of claim 7 wherein the conductive material is different than the support material.

* * * * *